United States Patent [19]

Blauvelt

[11] Patent Number: 5,252,930
[45] Date of Patent: Oct. 12, 1993

[54] PREDISTORTER FOR LINEARIZATION OF ELECTRONIC AND OPTICAL SIGNALS

[75] Inventor: Henry A. Blauvelt, San Marino, Calif.

[73] Assignee: Ortel Corporation, Alhambra, Calif.

[21] Appl. No.: 918,623

[22] Filed: Jul. 21, 1992

Related U.S. Application Data

[63] Continuation-in-part of Ser. No. 653,003, Feb. 8, 1991, Pat. No. 5,132,639, which is a continuation-in-part of Ser. No. 404,186, Sep. 7, 1989, Pat. No. 4,992,754.

[51] Int. Cl.$^5$ ............................................. H03F 1/32
[52] U.S. Cl. .................................... 330/149; 328/163
[58] Field of Search ..................... 330/149; 328/163; 332/159-161; 455/50.1, 63

[56] References Cited

U.S. PATENT DOCUMENTS

| | | | |
|---|---|---|---|
| 3,732,502 | 5/1973 | Seidel | 330/149 |
| 4,068,186 | 1/1978 | Sato | 330/149 |
| 4,392,253 | 7/1983 | Yamada et al. | 455/165 |
| 4,992,754 | 2/1991 | Blauvelt | 330/149 |
| 5,126,687 | 6/1992 | Onoda et al. | 330/149 |

FOREIGN PATENT DOCUMENTS

| | | |
|---|---|---|
| 585540 | 6/1989 | Australia . |
| 0132760 | 2/1985 | European Pat. Off. . |
| 55-4102A | 3/1980 | Japan . |
| 1519254 | 7/1978 | United Kingdom . |

OTHER PUBLICATIONS

Prochazka, et al., "Amplifier Linearization by Complementary Pre- or Post-Distortion", *IEEE Transactions on Cable Television*, vol. CATV-1, No. 1, Oct., 1974 pp. 31-39.

Asatani, et al., "Linearization of LED Nonlinearity by Predistortions", IEEE Transactions on Electron Devices, vol. ED-25, No. 2, Feb. 1978 pp. 207-212.

Childs, et al., "WH6 Predistortion linearization of directly modulated DFB Lasers and External Modulators for AM Video Transmission", OFC/Wednesday 24th,/79 2:30 P.M., one page.

Bertelsmeier, et al., "Linearization of Broadband Optical Transmission Systems by Adaptive Predistortion", *Frequenz Band 38* (Sep. 1984) pp. 206-212 (plus one page).

Primary Examiner—James B. Mullins
Attorney, Agent, or Firm—Christie, Parker & Hale

[57] ABSTRACT

An electronic circuit provides a linear output from an amplitude modulated transmission device such as an amplifier or a semiconductor laser which has inherent distortion. The distortion of the nonlinear device is compensated by applying a predistorted signal with distortion equal in magnitude and opposite in sign to the distortion introduced by the nonlinear device. The input signal is split into two paths with the primary part of the signal applied directly to the device, with a time delay to compensate for delays in the secondary path. The secondary path generates predistortion which is recombined with the primary signal in proper phase and amplitude for cancelling distortion in the output device. A distortion generator in the secondary path generates adjustable amplitude intermodulation signals. Filtering is used before the distortion generator to compensate for the dependence of the distortion of the nonlinear device on the frequencies of the fundamental signals. Filtering is used after the distortion generator to compensate for the dependence of the distortion of the nonlinear device on the frequency of the distortion. Phase of the distortion signal is adjusted to be in proper phase relation with the distortion of the device. Set points of the predistorter may be adjusted automatically. More than one secondary path may be used.

10 Claims, 4 Drawing Sheets

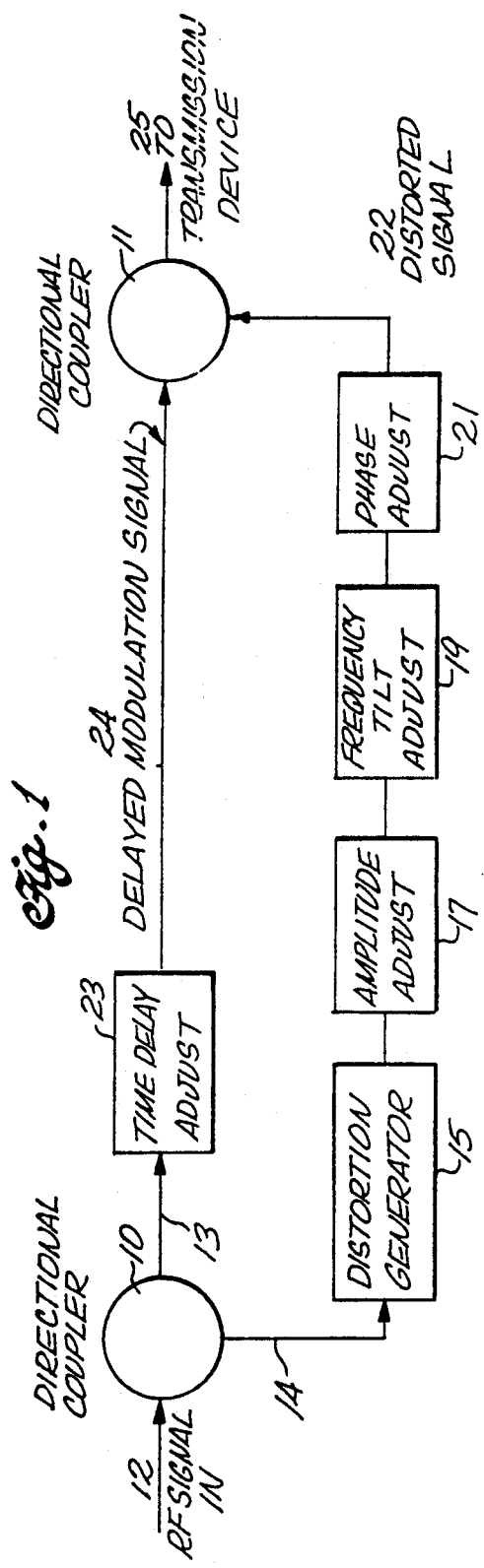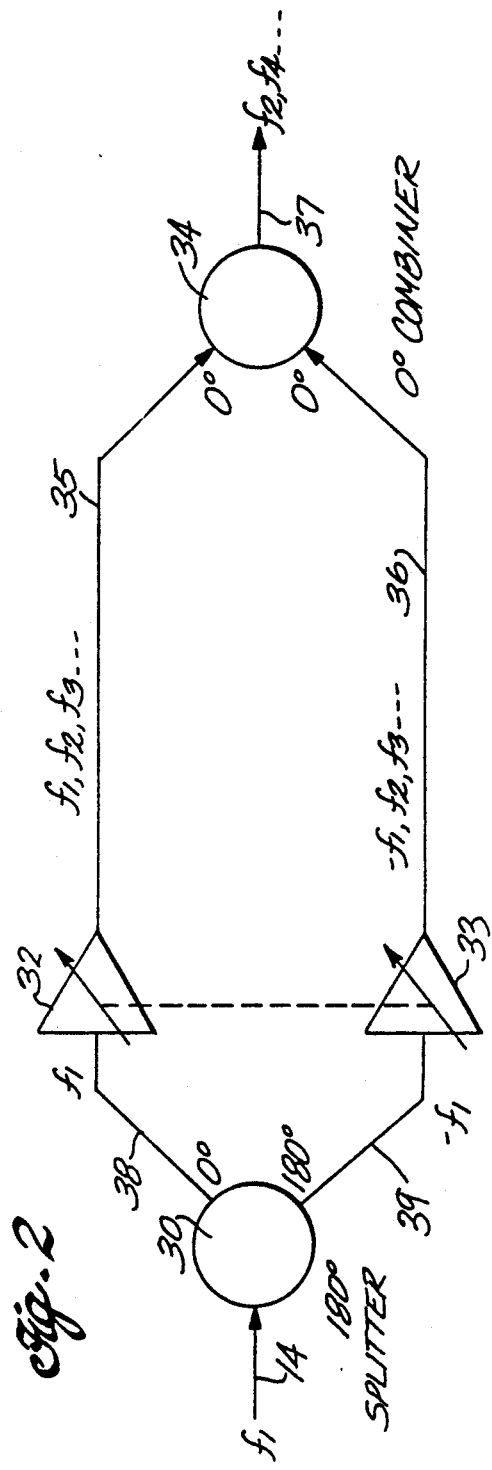

PREDISTORTER FOR LINEARIZATION OF ELECTRONIC AND OPTICAL SIGNALS

CROSS REFERENCE TO RELATED APPLICATIONS

This application is a continuation-in-part of U.S. patent application Ser. No. 07/653,003, filed Feb. 8, 1991, now U.S. Pat. No. 5,132,639, which is a continuation-in-part of U.S. patent application Ser. No. 07/404,186, filed Sep. 7, 1989, now U.S. Pat. No. 4,992,754. The subject matter of these prior applications in hereby incorporated by reference.

BACKGROUND OF THE INVENTION

This invention relates to an electronic circuit for providing a linear output from an amplitude modulated transmission device such as a semiconductor laser which has an output distorted from its input due to inherent nonlinearity. The distortion of the nonlinear device is compensated by applying a predistorted signal to the input of the nonlinear device. The predistortion is chosen such that the distortion of the nonlinear device restores the undistorted signal.

Directly modulating the analog intensity of a light emitting diode (LED) or semiconductor laser with an electrical signal is considered among the simplest methods known in the art for transmitting analog signals, such as sound and video signals, on optical fibers. Although such analog techniques have the advantage of significantly smaller bandwidth requirements than digital pulse code modulation, or analog or pulse frequency modulation, amplitude modulation may suffer from noise and non-linearity of the optical source.

Distortion inherent in certain analog transmitters prevents a linear electrical modulation signal from being converted linearly to an optical signal, and instead causes the signal to become distorted. These effects are particularly detrimental to multi-channel video transmission which requires excellent linearity to prevent channels from interfering with each other. A highly linearized analog optical system has wide application in commercial TV transmission, CATV, interactive TV, and video telephone transmission.

One method employed in the past to reduce distortion inherent in nonlinear devices has been predistortion. In this technique, a modulation signal is combined with a signal equal in magnitude to the distortion inherent in the nonlinear device but opposite in sign. When the nonlinear device modulates the combined signal, the device's inherent distortion is cancelled by the combined signal's predistortion and only the linear part of the source signal is transmitted.

As described in the parent application, a predistortion technique divides an input signal into two or more electrical paths and generates predistortion on one or more of the paths resembling the distortion inherent in the nonlinear transmitting device. The generated predistortion is the inverse of the nonlinear device's inherent distortion and serves to cancel the effect of the device's inherent distortion when recombined with the input signal.

Attenuation is used to match the magnitude of the predistortion to the magnitude of the device's inherent distortion characteristics before the signals are recombined and sent to the nonlinear device for modulation.

The method compensates for the distortion of nonlinear devices in which the amplitude and phase of the distortion depends on the frequency of the distortion signal.

An additional effect of frequency may appear in some nonlinear devices. Some nonlinear devices exhibit the characteristic that the distortion generated depends on the frequencies of the fundamental signals in addition to the previously described dependence on the frequency of the distortion signal. As an example, a device with a second order nonlinearity may generate distortion at 50 MHz due to fundamental signals at 100 MHz and 150 MHz, or due to fundamental signals at 500 MHz and 550 MHz. In some nonlinear devices, the distortion generated by these two pairs of fundamental frequencies can be substantially different. If this is the case, the circuit described in the parent application may not adequately correct for the nonlinear distortion signal at 50 MHz.

In practice of this invention, a filter is included in a secondary path preceding the distorter so that devices exhibiting distortion that is dependent on the frequencies of the fundamental can be linearized in a substantially more effective manner.

It may also be desirable to change the predistortion as the laser or the predistortion circuitry ages and changes characteristics. Preferably, this is done automatically.

As predistortion circuits have become more sophisticated, additional refinements for greater linearity and use for other applications have been recognized. The present invention accordingly is addressed to these and other desirable features.

BRIEF SUMMARY OF THE INVENTION

Thus, in practice of this invention according to a presently preferred embodiment, a predistortion circuit for reducing distortion in the transmission of analog signals splits an input modulation signal into two electrical paths, one primary and one secondary path. A distortion generator in the secondary path generates intermodulation distortion products of the input signal.

In one embodiment, fundamental signals in the secondary path are filtered before being injected into the distortion generator. After the distortion generator, the distortion products are also filtered. The filters are chosen to result in distortion which has the same dependence on the frequencies of the fundamental signals and same dependence on the frequency of the distortion signal as the nonlinear device which is to be linearized. The phase and level of the intermodulation products are also adjusted to the optimum levels for cancelling distortion in the nonlinear device. The primary and secondary signals are then recombined to produce a single modulation signal including intermodulation product distortion.

One may readjust the settings of the predistorter intermittently by detecting distortion remaining in the output of the nonlinear device and intermittently making changes in the settings in response thereto for minimizing distortion remaining in the output of the nonlinear device.

BRIEF DESCRIPTION OF THE DRAWINGS

These and other features and advantages of this invention will be better understood and more fully appreciated by reference to the following detailed description when considered in conjunction with the accompanying drawings, wherein:

FIG. 1 is a block diagram showing a first embodiment of a predistortion circuit;

FIG. 2 is a block diagram of an exemplary push-push amplifier employed in a predistortion circuit;

DETAILED DESCRIPTION

Figure 3:
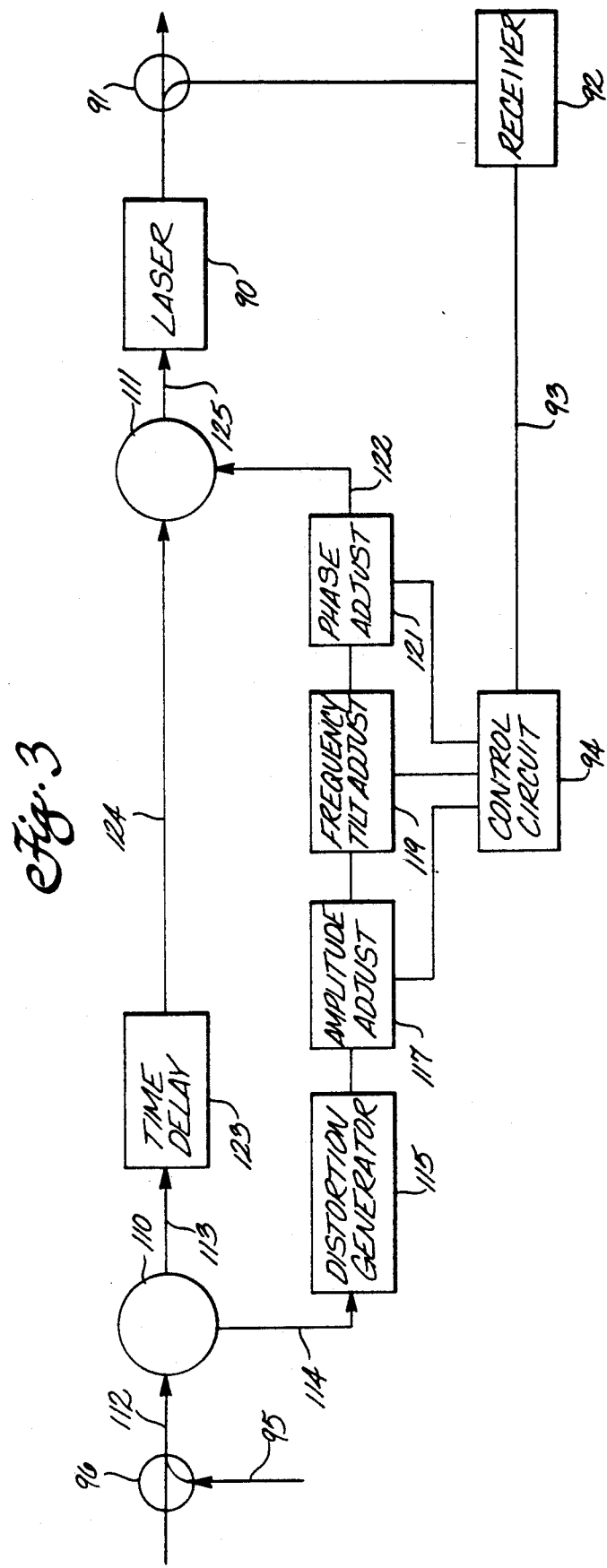
FIG. 3 is a schematic block diagram illustrating a technique for automatically readjusting the predistortion.

Referring now to FIG. 1, an input source signal 12 feeds into a directional coupler 10 and is split into a primary electrical path 13 and a secondary electrical path 14. Typically, the portion of the signal on the primary electrical path is substantially larger in power than the signal on the secondary electrical path.

The secondary electrical path comprises in series a distortion generator 15, an amplitude adjustment block 17, a "tilt" or frequency adjustment block 19, and a fine phase adjustment block 21. These elements may be varied in sequence along the secondary electrical path without departing from the functional purpose of the invention. If desired, an additional secondary path may also be used in parallel with the first mentioned secondary path, as described in the parent application. In such an embodiment, one of the secondary paths may generate even order intermodulation products and the other secondary path generate odd order intermodulation products.

In the illustrated embodiment, the signal on the secondary electrical path feeds first into the distortion generator. The output of the distortion generator comprises intermodulation distortion of the input frequencies. Second order or second and higher order distortion may be produced. Preferably, the fundamental frequency is suppressed in the distortion generator by cancellation or other means.

The output from the distortion generator is processed through an amplitude adjustment circuit 17, a frequency tilt adjust circuit 19 and a phase adjust circuit 21. These circuits adjust the distortion signals in such a manner that after recombining with the fundamental signals the distortion will be equal in amplitude and opposite in sign to that generated by the transmission device 25.

The amplitude matching function occurs in the amplitude adjustment block, and this adjustment may be accomplished manually with a variable attenuator, or automatically with an automatic gain control element, for example.

Generation of the predistortion signal on the secondary electrical path typically involves a time delay relative to the primary electrical path. Before the primary and secondary paths are recombined an adjustment is made to set the relative phase of the primary path electrical signal with respect to the phase of the secondary path electrical signal which results in best cancellation of the distortion inherent in the nonlinear device. This phase matching is done on the primary electrical path by an external delay 23 which receives the primary portion of the signal 13 split by the directional coupler 10. The time delay may be manually or automatically adjusted.

An exemplary transmission device may be a semiconductor laser or LED modulated by the output signal. The inherent distortion of such a device is not independent of frequency. Generally speaking, the distortion is inherently greater at higher frequencies.

To adjust for frequency dependent distortion of the nonlinear transmitting device, the output of the amplitude adjustment block is then fed into a frequency adjustment or "tilt" adjustment block 19. The tilt adjustment is a variable filter or other similar means which increases the amplitude of the distortion at high frequencies for an "up-tilt" and decreases it at high frequencies for a "down-tilt." This adjustment, like the amplitude adjustment, may be done either manually or automatically. By passing more or less of the high frequency distortion products than the low-frequency distortion products, the tilt adjustment enables the predistortion signal to be tailored more precisely to the inherent distortion characteristics of the nonlinear device.

Typically, the amplitude adjustment is made to compensate for the distortion occurring at the low frequency end of the band. The frequency adjustment is then made as an up-tilt to compensate for distortion at the high frequency end of the band. It may be noted that this same effect can be achieved by amplitude adjustment at the high frequency end, and an up-tilt or down-tilt on the low-frequency end as an appropriate attenuation or amplification of the signal.

An additional fine phase adjustment block 21 on the secondary electrical path provides for more accurate setting of the relative phase between the distortion generated in the secondary path and the distortion inherent in the nonlinear device. This adjustment, like the amplitude adjustment, may also be made manually and may be frequency dependent.

It is significant that the phase adjustment is made relative to the distortion of the device. Previously, time delays have been introduced so that the predistortion is exactly in phase (or 180° out of phase) with the primary signal. This may be sufficient for some purposes, but is not suitable for others, such as TV bandwidth modulation of a laser, for example.

Once the relative phases of the signals on the primary and secondary electrical paths have been set, they are recombined by the output directional coupler 11. The combined signal 25, including the predistortion component from the secondary path, is output to a nonlinear transmission device for modulation of the signal.

An example of a predistorter or distortion amplifier block 15 is shown in detail in FIG. 2. A portion of the input signal 14 on the secondary electrical path is fed into a 180° splitter 30 which divides the signal into a first electrical path 38 and a second electrical path 39 of equal magnitude and opposite sign.

The first electrical path feeds into a first amplifier 32 generating second order and higher order intermodulation products of the fundamental frequencies in the input signal 14. The second electrical path, carrying a signal opposite in sign to the first electrical path, feeds into a second amplifier 33 generating even order intermodulation products which are of the same sign as those output by the first amplifier 32, but generating odd order intermodulation products opposite in sign to those output by the first amplifier. The signals are combined additively by a 0-degree combiner 34 which substantially reduces the fundamental frequencies and odd order intermodulation products, leaving even order intermodulation product components in an output signal 37. Ideally, this process produces pure second order and higher order even components of intermodulation distortion.

The first and second amplifiers 32 and 33 are adjustable to prevent complete cancellation of the odd order intermodulation product components, if desired. This adjustment can be accomplished by varying the bias currents to the amplifiers which has little effect on gain of the fundamental frequencies. An increase in the bias current of the first amplifier 32 with a corresponding decrease in the bias current of the second amplifier 33 will unbalance the two amplifiers in the sense that the magnitude of intermodulation products produced will no longer be identical between the two amplifiers. Thus, the odd order intermodulation products will not cancel one another.

The unbalancing of this distortion circuit, which is referred to as a push-push amplifier, allows generation of intermodulation distortion of all orders of interest for predistortion purposes. The fundamental frequencies may be suppressed by particular amplifier design or by filtering means (not shown), either in series with, after or integral to each amplifier. Preferably, the bias currents of both amplifiers 32 and 33 are adjusted in equal and opposite directions or senses, so that the unbalance affects only the odd order intermodulation products and the even order intermodulation products remain balanced and substantially unchanged in magnitude.

One embodiment of the predistortion circuit is shown in FIG. 3 of the aforementioned patents.

The signal in the secondary path is recombined with the signal in the primary path by way of the directional coupler 11, and the signal 25 thereby predistorted is applied to a laser or the like for modulation.

Figure 5:
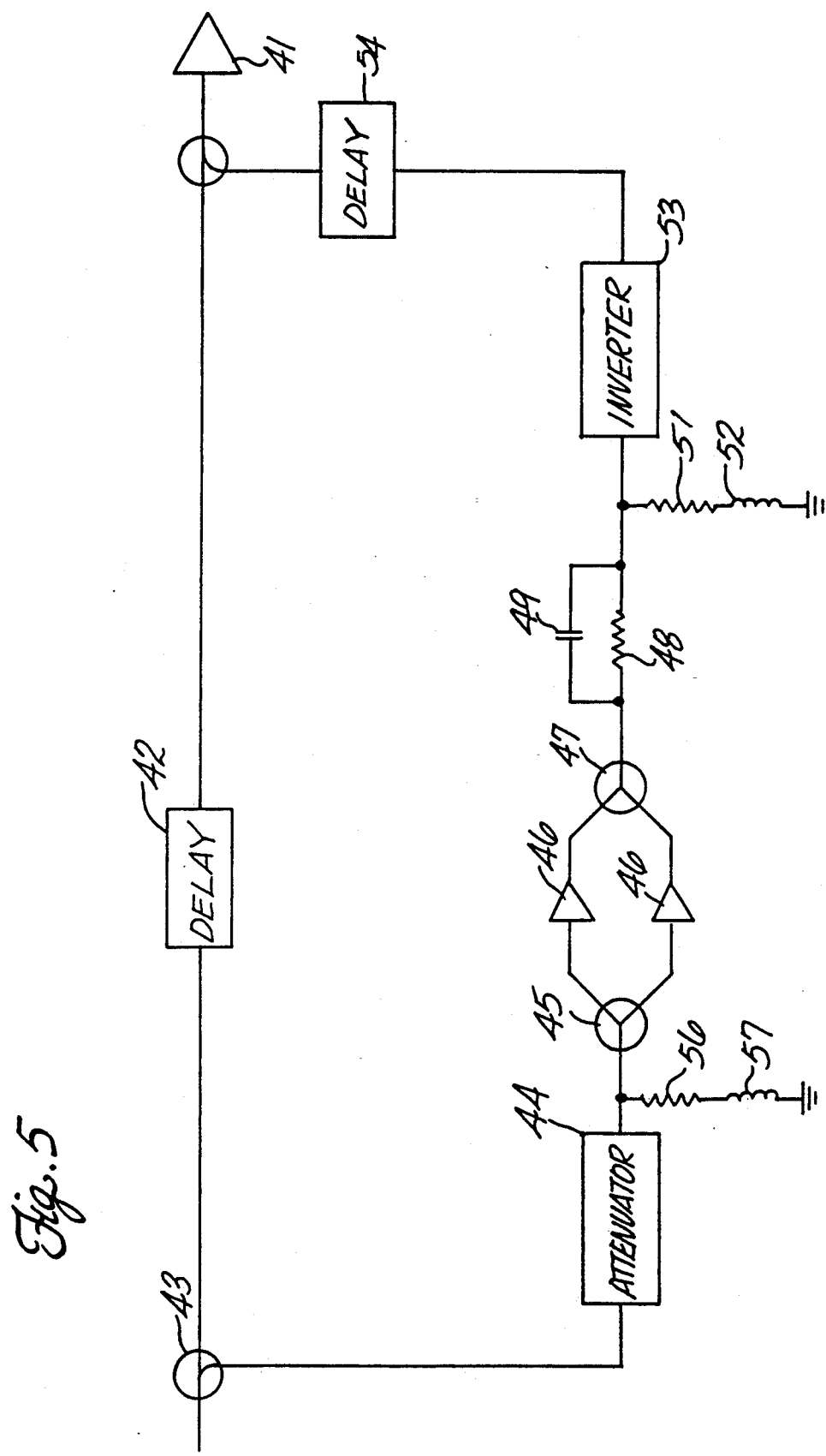
FIG. 5 is a schematic circuit diagram of another embodiment of a predistorter.

In the previously described embodiment, there is a single secondary signal path with its distortion generator. If desired, as shown in FIG. 5 of the aforementioned patents, an additional "secondary" path may be employed with one path generating second order cancellation signals and another path generating third order cancellation signals. In the event two or more secondary paths are used for high order distortion, the amplitude, tilt and phase in either path may be adjusted first since there is no interaction between them.

If it is desired to cover a broader frequency range than the simple circuit of FIG. 2 one may use systems as described and illustrated in FIGS. 6 to 10 of the aforementioned patents. It will be understood that the improvements described herein are useful in such embodiments without need to repeat the description of the systems and subsystems described in the patents, which are incorporated by reference.

There are times when it may be desirable to automatically adjust such predistortion circuitry to compensate for changes that may occur in the nonlinear device. For example, over a number of years' operation, a laser or the predistorter may age and the distortion may shift so that the original settings of the predistortion circuit no longer completely minimize distortion in the output of the laser. Under these circumstances, if intermittent recalibration is desired, a user may connect to a recalibration unit which automatically detects any distortion remaining in the laser output and readjusts the settings of any of the adjustments of the predistortion circuit for minimizing the remaining distortion.

An automatic compensation for remaining distortion may also be desirable in much shorter time intervals to compensate for changes in distortion caused by other influences such as temperature changes. If that is desired, a recalibration circuit may be permanently connected to the predistortion circuitry for intermittently detecting any remaining distortion in the laser output, and changing the settings of the predistortion circuit for minimizing the remaining distortion. Such a recalibration circuit may be operated intermittently, or even continuously, during use of the laser without interfering with its normal operation. The recalibration technique is the same for either of these purposes, and differs only in how often recalibration is desired.

Such a recalibration system can be understood by reference to a predistorter as illustrated in FIG. 3. Reference numerals in this drawing for like elements are the same as the reference numerals used in FIG. 1 increased by 100. Thus, for example, the input signal is indicated as 12 in FIG. 1 and as 112 in FIG. 3. In the predistorter, an input source signal 112 is fed into a directional coupler 110 where it is split into a primary electrical path 113 and a secondary electrical path 114. The secondary electrical path has in series a distortion generator 115, an amplitude adjustment block 117, a tilt or frequency adjustment block 119, and a fine-phase adjustment block 121. The circuit output is used to modulate a non-linear device 90 such as a semiconductor laser.

The output of the distortion generator 115 comprises intermodulation distortion of the input frequencies. Second order or second and higher order distortion may be produced. The fundamental frequency is suppressed. The amplitude adjustment block is used for adjusting the amplitude of the distortion to match the inherent distortion predicted in a nonlinear output device 90, such as a modulated semiconductor laser.

The modulation signal 124 in the primary electrical path is delayed by a delay line 123 to bring the signals in the primary and secondary electrical paths roughly in phase. A fine-phase adjustment block 121 in the secondary electrical path is used for bringing the predistortion in the secondary path in phase with (or more precisely, 180° out of phase with) the distortion inherent in the nonlinear device.

To adjust for frequency-dependent distortion of the nonlinear device, the output of the amplitude adjustment block is fed into a frequency adjustment or tilt block 119. The tilt adjustment is a variable filter which changes the amplitude of distortion at high frequencies relative to the amplitude at low frequencies to more precisely match the inherent distortion characteristics of the nonlinear device. The distorted signal 122 produced by these circuit elements in the secondary electrical path is combined with the primary modulation signal 124 by a second directional coupler 111 for application as an input signal to the nonlinear device 90. This operation of the predistorter is the same as previously described.

To make the predistorter adaptive to changes in distortion in the nonlinear device, a fraction of the output signal (such as a light beam in the case of a laser) is diverted by a splitter 91 to a receiver 92. The receiver detects distortion, if any, remaining in the output signal from the device, and generates a distortion level signal 93 for a recalibration control circuit 94.

The receiver may be set to isolate frequencies where distortion is expected for detecting any residual distortion in the output of the nonlinear device. Alternatively, one applies a set of pilot tones 95 to the input signal by way of a directional coupler or splitter 96. The receiver can then be set to detect distortion from the input pilot tones. For example, the pilot tones may include frequencies $f_1$ and $f_2$. The receiver may then detect frequencies $f_1+f_2$ and $f_1-f_2$. A number of such pilot tones may be input at various parts of the frequency range of the system for cancellation of distortion occurring any place in the frequency range.

The control circuit 94 for recalibration follows an algorithm for checking the level of distortion in the output, changing a setting in the predistortion circuitry, sensing a change in the distortion level, and making a change in a setting of the predistortion circuit, if appropriate, for minimizing distortion. A number of algorithms may be used by the control circuit for making the adjustments in set points for minimizing distortion.

Probably the easiest to understand is one involving sequential incremental changes in set point of each parameter. For example, one may first adjust the amplitude setting. First, the control circuit increases the set point (e.g., a voltage) by a small increment, and the change in distortion as a result of that incremental change is measured. If the distortion increases, it is apparent that the incremental adjustment should be reversed. The control circuit would then make an incremental adjustment in the opposite direction. If the distortion again increases, it would be known that the original set point was correct, and the control circuit would return to the original set point.

On the other hand, if the incremental adjustment results in the distortion decreasing, an additional incremental adjustment in set point is made and the distortion again measured. Additional incremental changes are made as long as each increment decreases the distortion. When an additional incremental change in the set point results in an increase in distortion, it is known that the optimum set point has been passed, and the control circuit reverses that increment.

Once the optimum amplitude set point is found, a similar series of incremental adjustments are made in the set point for the fine phase adjustment. This incremental search is continued until the optimum set point for the phase adjustment is achieved.

Next, one may make a sequence of incremental changes in the tilt adjustment and measure low-frequency distortion to determine an optimum tilt adjustment setting.

The amplitude, phase and tilt adjustments are not completely independent. Thus, when the "optimum" phase and tilt adjustments have been made, the amplitude adjustment may no longer be at the optimum setting. Thus, it is desirable to again make sequential incremental adjustments in the amplitude setting, and so on for each set point, until a desired minimum of distortion is obtained.

Other types of adjustment algorithms are also known and used for other purposes. For example, a somewhat more complex technique, which may be referred to as a gradient search, may be used to adjust multiple parameters simultaneously and thereby approach the optimum settings more rapidly than the sequential incremental search just described.

In one of these techniques, an adjustment setting is modulated at a low frequency, as low as 1 to 10 Hz. The modulation of the distortion at that frequency is then observed. If the modulation of the distortion is in phase with the modulation of the adjustment setting, the adjustment is too high. If the modulation of the distortion is out of phase, the adjustment setting is too low. If the adjustment setting is at the optimum, there will be zero modulation of the distortion at the modulation frequency of the setting, and one will instead see distortion modulation at twice the input frequency.

With this gradient search technique, a second adjustment parameter can be modulated at a second frequency and measured simultaneously with the first modulation. Additional set point adjustments may be modulated at additional frequencies. Thus, in principle, any number of set point adjustments may be made simultaneously for rapidly achieving recalibration. With a predistorter as described herein, only three or four set point adjustments would typically need to be made in the even order secondary path. Three or four set point adjustments might also be made in the third order path.

Other automatic algorithms for adjusting the set points of amplitude, phase and tilt may also be used.

The automatic adjustment of the predistorter would typically call for use of resistors or capacitors variable in response to a voltage, for example. A suitable variable resistor is a PIN diode. A varactor diode is a suitable voltage-variable capacitor.

The intermittent adjustment of the set points of the predistorter should be distinguished from feed-forward linearization. In feed-forward linearization, a sample is continuously taken of an output signal from the nonlinear device. The sample is compared with the input signal and differences are identified as distortion. The differences are amplified as required and applied to a device similar to the nonlinear device to produce a second output signal corresponding to the distortion. That second output signal is then added to the distorted output signal, with suitable delay to have proper phase relation between the added signals to compensate for the distortion. In other words, instead of predistorting the input signal to the nonlinear device, the opposite of the distortion is added to the output of the nonlinear device to cancel the distortion. Such changes are continuously made in the distortion in real time.

There are some systems for which tilt of the intermodulation products is not sufficient for fully compensating for frequency dependence of distortion. An additional effect of frequency may appear in some nonlinear devices. Some nonlinear devices exhibit the characteristic that the distortion generated depends on the frequencies of the fundamental signals, in addition to the dependence on the frequency of the distortion signal. As an example, a device with a second order nonlinearity will generate distortion at 50 MHz due to fundamental signals at 100 MHz and 150 MHz, or due to fundamental signals at 500 MHz and 550 MHz. In some devices, the distortion generated by these two pairs of fundamental frequencies may be substantially different. If this is the case, the circuit described in the parent application cannot adequately correct for the nonlinear distortion signal at 50 MHz. Simply applying the difference frequencies, even with the tilt adjustment, may leave some residual distortion.

Figure 4:
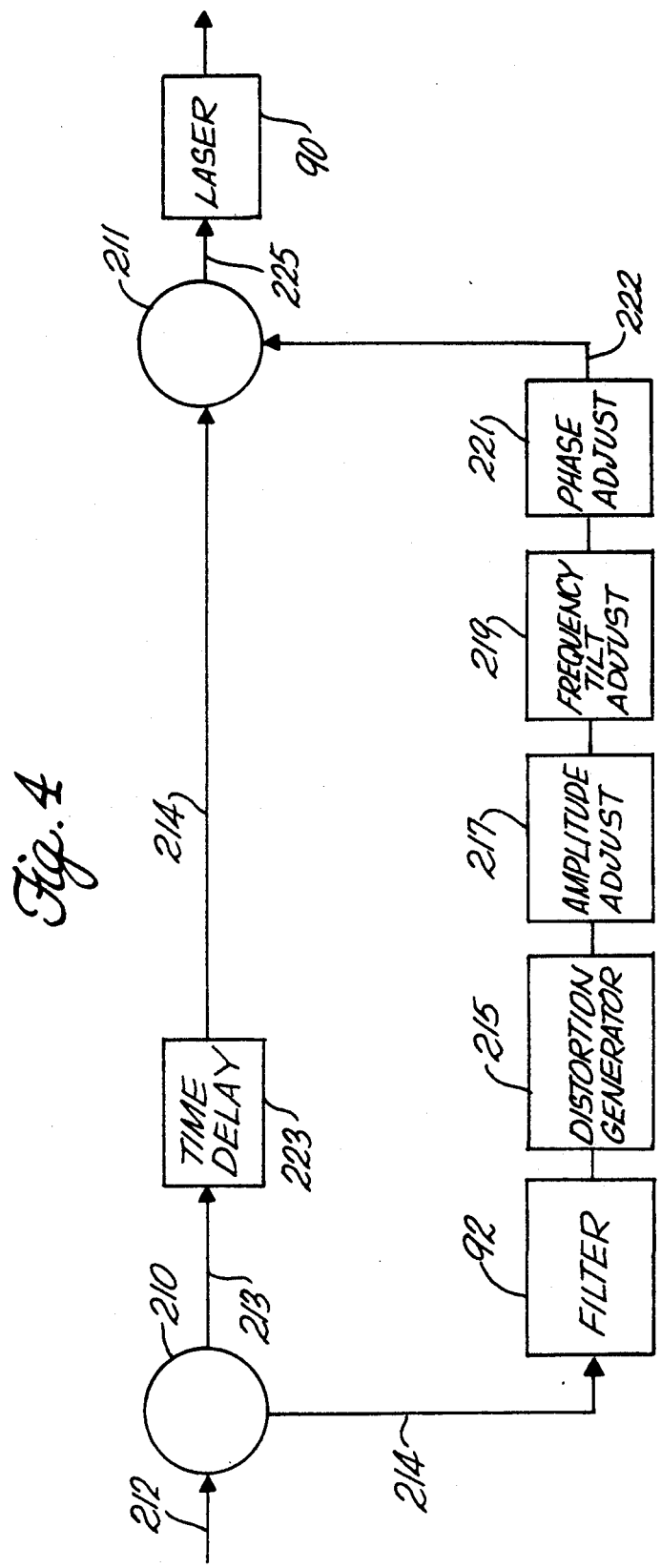
FIG. 4 is a schematic block diagram illustrating an improved technique for compensating for frequency dependence of distortion.

It is found that this effect can be largely eliminated by filtering the signals before the distortion is generated. Thus, as illustrated in FIG. 4, an input signal 212 is fed into a directional coupler 210 where it is split into a primary electrical path 213 and a secondary electrical path 214. As previously described, the secondary electrical path has in series a distortion generator 215, an amplitude adjustment block 217, a tilt or frequency adjustment block 219, and a fine-phase adjustment block 221. The circuit output is used to modulate a non-linear device 290 such as a semiconductor laser.

The modulation signal 224 in the primary electrical path is delayed by a delay line 223 to bring the primary and secondary electrical signals roughly in phase. The fine phase adjustment block in the secondary electrical path is used for bringing the predistortion in the secondary path in phase with distortion in the laser. The dependence of the distortion level on the frequency of the distortion is compensated by the frequency adjustment or tilt block 219. The distorted signal 222 produced by these circuit elements in the secondary electrical path is combined with the primary modulation signal 224 by a second directional coupler 211 for application to the laser. This operation of the predistorter is the same as previously described.

In addition, an adjustable filter 92 is provided in the circuit before the distortion generator 215. The pre-filter provides a tilt before the distortion generator. Thus, the difference intermodulation products from the low frequency end of the band coming out of the distortion generator have a different amplitude than the intermodulation products from the higher frequency end of the band. Then superimposing the frequency tilt adjustment following the distortion generator as described above can do a better job of compensating for distortion in the laser.

FIG. 5 illustrates a circuit for providing predistortion of an output device, such as an amplifier 41, which has reasonably predictable distortion characteristics, but has appreciable frequency dependence of distortion. The amplifier has two kinds of frequency dependence of distortion. The distortion is dependent on the frequency of the fundamental frequencies in the input signal, and is also dependent on the frequencies of the distortion itself. The first type of frequency dependence is remedied by a pre-filter before a distortion generator and the second is remedied by a post-filter after the distortion generator.

The main power of the signal to the amplifier is passed through a delay 42 in a primary path. A directional coupler 43 splits off a minor portion of the signal to a secondary path where predistortion is generated. The amplitude of the signal in the secondary path is adjusted by a variable attenuator 44 and is split into two paths by a splitter 45. Each of these split signals is amplified in a push-pull pair of amplifiers 46 and they are then recombined at another splitter 47. The amplifiers are balanced so no even order intermodulation products are produced.

A post-filter for the combined signals in the secondary path is formed of a series resistor 48 in parallel with a capacitor 49, the output of which is connected to ground by a resistor 51 in series with a small inductor 52. As in other embodiments, the post-filter adjusts the tilt of the predistortion signal, that is, its amplitude as a function of frequency.

The predistortion signal is inverted by an inverter 53 and its phase is adjusted by a variable delay 54 so that the predistortion is in proper phase relation with the distortion of the amplifier. As previously pointed out, these components of the secondary path need not be in the sequence illustrated.

In this embodiment, to compensate for distortion of the amplifier which is a function of the fundamental frequency of the main signal, a pre-filter is provided before the distortion amplifiers 46. The pre-filter is simply a connection to ground by a resistor 56 and inductor 57. This modifies the signal in the secondary path so that the higher frequency portion of the fundamental is amplified differently from the lower frequency portion. The combination of pre-filter and post-filter can significantly compensate for frequency dependent distortion in the amplifier 41.

The arrangement illustrated in FIG. 5 produces third order intermodulation products, which are used to compensate the principal distortion mode in some amplifiers. Such a predistorter is quite economical and significantly improves the performance of the amplifier at low cost. If required for greater linearity in the amplifier, the pre-filter and/or the post-filter may be made with variable values. Many amplifiers are predictable in their distortion, so the fixed values of the filters are sufficient. Likewise, if desired for a specific embodiment, an additional even order predistortion secondary path may also be used.

Many variations and modifications will be apparent to those skilled in the art without departing from the spirit and scope of the invention. For example, although described and illustrated in the context of a TV signal modulating a laser or light emitting diode, other nonlinear devices such as amplifiers may have inherent distortion largely cancelled by this technique.

The automatic adjustment of set points has been described in the context of a system with only second order intermodulation products. It will be apparent that it may also be used in a system having an additional secondary path for generating third order intermodulation products. Similarly, the use of tilt before the distortion generator in the embodiment illustrated in FIG. 4 may also be applicable to a system with a third order path. The pre-filter before the distortion generator may be sufficient for adjusting the frequency dependence of some systems and the frequency adjustment following the distortion generator may be eliminated. Both are preferred for full adjustability of predistortion for a broad range of devices.

The most sophisticated predistortion system incorporates all of these features, such as multiple secondary paths, independent phase adjustments in each path, both an adjustable pre-filter and an adjustable post-filter in each path, etc. Where less linearity is tolerable, or where the output device does not have the distortion requiring such sophisticated correction, fewer of the features in various combinations may be used.

Because of such variations, the invention may be practiced other than as specifically described.

What is claimed is:

1. A predistortion circuit comprising:
   means for splitting an input modulation signal into a primary electrical path and at least one secondary electrical path;
   a distortion generator in the secondary electrical path for producing even order intermodulation products of the input frequencies and suppressing the fundamental frequencies;
   means for combining signals on the primary and secondary signal paths into a single signal for modulating a nonlinear device with predictable distortion characteristics;
   means in the secondary electrical path for adjusting the relative amplitude and phase of the signal from the distortion generator; and
   filter means before the distortion generator for altering the input signal to the distortion generator as a function of frequency such that the dependence of the intermodulation distortion generated by the predistortion circuit on the frequencies of the input signal matches the frequency dependent distortion of the nonlinear device.

2. A predistortion circuit as recited in claim 1 comprising means in the secondary electrical path for adjusting the relative amplitude and phase of the distortion signal from the distortion generator as a function of frequency to match the distortion of the nonlinear device.

3. A predistortion circuit as recited in claim 1 wherein the distortion generator comprises a push-push amplifier circuit.

4. A predistortion circuit as recited in claim 1 further comprising:
means for detecting distortion remaining in the output of the nonlinear device; and
means for automatically changing the setting of the means for adjusting amplitude in response to the means for detecting, for minimizing distortion remaining in the output of the nonlinear device.

5. A predistortion circuit as claimed in claim 4 further comprising means for automatically changing the setting of the means for adjusting the phase of the intermodulation products relative to the fundamental signals in response to the means for detecting, for minimizing distortion remaining in the output of the nonlinear device.

6. A predistortion circuit comprising:
means for splitting an input modulation signal into a primary electrical path and at least one secondary electrical path;
a distortion generator in the secondary electrical path for producing odd order intermodulation products of the input frequencies and suppressing even order intermodulation products;
means in the secondary electrical path for adjusting the amplitude and phase of the signal from the distortion generator;
post-filter means in the secondary electrical path after the distortion generator for altering the output signal from the distortion generator as a function of frequency;
pre-filter means before the distortion generator for altering the input signal to the distortion generator as a function of frequency; and
means for combining signals on the primary and secondary signal paths into a single signal for modulating a nonlinear device with predictable distortion characteristics.

7. A predistortion circuit as recited in claim 6 wherein at least one of the filter means is adjustable.

8. A predistortion circuit as recited in claim 6 wherein the distortion generator comprises a push-pull amplifier circuit.

9. A predistortion circuit as recited in claim 6 further comprising:
means for detecting distortion remaining in the output of the nonlinear device; and
means for automatically changing the setting of the means for adjusting amplitude in response to the means for detecting, for minimizing distortion remaining in the output of the nonlinear device.

10. A predistortion circuit as claimed in claim 9 further comprising means for automatically changing the setting of the means for adjusting the phase of the intermodulation products relative to the fundamental signals in response to the means for detecting, for minimizing distortion remaining in the output of the nonlinear device.

* * * * *